(12) United States Patent
Bohr et al.

(10) Patent No.: US 7,180,195 B2
(45) Date of Patent: Feb. 20, 2007

(54) METHOD AND APPARATUS FOR IMPROVED POWER ROUTING

(75) Inventors: Mark T. Bohr, Aloha, OR (US); Robert W. Martell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 10/739,726

(22) Filed: Dec. 17, 2003

(65) Prior Publication Data

US 2005/0133894 A1   Jun. 23, 2005

(51) Int. Cl.
*H01L 23/48* (2006.01)
*H01L 21/44* (2006.01)
*H01L 21/4763* (2006.01)

(52) U.S. Cl. .................. 257/780; 257/757; 257/758; 257/772; 257/778; 257/779; 438/612; 438/613; 438/622; 438/623

(58) Field of Classification Search ............. None
See application file for complete search history.

(56) References Cited

U.S. PATENT DOCUMENTS

| | | | |
|---|---|---|---|
| 4,223,337 A | 9/1980 | Kojima et al. | |
| 5,404,045 A | 4/1995 | Mizushima et al. | |
| 5,410,184 A | 4/1995 | Melton et al. | |
| 5,426,266 A | 6/1995 | Brown et al. | |
| 5,436,412 A * | 7/1995 | Ahmad et al. | 174/265 |
| 5,492,235 A | 2/1996 | Crafts et al. | |
| 5,674,780 A | 10/1997 | Lytle et al. | |
| 5,847,466 A | 12/1998 | Ito et al. | |
| 5,854,513 A * | 12/1998 | Kim | 257/737 |
| 5,883,435 A * | 3/1999 | Geffken et al. | 257/758 |
| 6,093,630 A * | 7/2000 | Geffken et al. | 438/612 |
| 6,179,200 B1 | 1/2001 | Kung et al. | |
| 6,387,734 B1 * | 5/2002 | Inaba et al. | 438/125 |
| 6,404,051 B1 | 6/2002 | Ezawa et al. | |
| 6,437,431 B1 | 8/2002 | Mbouombouo et al. | |
| 6,464,122 B1 | 10/2002 | Tadauchi et al. | |
| 6,472,763 B2 * | 10/2002 | Fukuda et al. | 257/780 |

(Continued)

FOREIGN PATENT DOCUMENTS

JP    54043675    4/1979

(Continued)

OTHER PUBLICATIONS

PCT Int'l. Search Report, Int'l. Application No. PCT US2004/039639, Int'l. filing date Nov. 24, 2004, mailing date Aug. 5, 2005 (5 pages).

(Continued)

*Primary Examiner*—Carl Whitehead, Jr.
*Assistant Examiner*—James M. Mitchell
(74) *Attorney, Agent, or Firm*—Cyndi M. Wheeler

(57) ABSTRACT

An apparatus comprising: a die having a top metal layer, the top metal layer comprised of at least a first metal line and a second metal line; a passivation layer covering the top metal layer; a C4 bump on the passivation layer; and a first passivation opening and a second passivation opening in the passivation layer, the first passivation opening to connect the first metal line to the C4 bump, and the second passivation opening to connect the second metal line to the C4 bump.

20 Claims, 4 Drawing Sheets

U.S. PATENT DOCUMENTS

| | | | |
|---|---|---|---|
| 6,495,917 B1 * | 12/2002 | Ellis-Monaghan et al. | 257/758 |
| 6,563,216 B1 * | 5/2003 | Kimura et al. | 257/737 |
| 6,577,017 B1 | 6/2003 | Wong | |
| 6,613,662 B2 | 9/2003 | Wark et al. | |
| 6,686,664 B2 * | 2/2004 | Caletka et al. | 257/778 |
| 6,815,324 B2 * | 11/2004 | Huang et al. | 438/612 |
| 6,841,413 B2 * | 1/2005 | Liu et al. | 438/106 |
| 6,913,946 B2 * | 7/2005 | Lin | 438/106 |
| 6,927,491 B1 * | 8/2005 | Yamada | 257/737 |
| 7,023,067 B2 * | 4/2006 | Allman et al. | 257/459 |
| 7,026,721 B2 * | 4/2006 | Chen | 257/779 |
| 2001/0008311 A1 * | 7/2001 | Harada et al. | 257/758 |
| 2002/0068441 A1 * | 6/2002 | Lin | 438/637 |
| 2002/0079584 A1 * | 6/2002 | Matsunaga | 257/758 |
| 2002/0158341 A1 * | 10/2002 | Murayama | 257/780 |
| 2003/0067066 A1 | 4/2003 | Kondou | |
| 2003/0122258 A1 | 7/2003 | Bobba et al. | |
| 2003/0205817 A1 * | 11/2003 | Romankiw | 257/758 |
| 2004/0253801 A1 * | 12/2004 | Lin | 438/612 |

FOREIGN PATENT DOCUMENTS

| | | |
|---|---|---|
| JP | 57106056 | 7/1982 |
| JP | 60007758 | 1/1985 |
| JP | 61049452 | 3/1986 |
| JP | 62176140 | 8/1987 |
| JP | 03019248 | 1/1991 |
| JP | 05013418 | 1/1993 |
| JP | 0516614 | 7/1993 |
| JP | 05206198 | 8/1993 |
| JP | 07335679 | 12/1995 |
| JP | 09082714 | 3/1997 |
| JP | 08204136 | 8/1998 |
| JP | 10270484 | 10/1998 |
| WO | WO 99/34423 | 7/1999 |

OTHER PUBLICATIONS

Webster's II new Riverside University Dictionary, 1994 edition, Riverside Pub., p. 1056.

International Search Report PCT/US/01/18750.

* cited by examiner

METHOD AND APPARATUS FOR IMPROVED POWER ROUTING

BACKGROUND OF THE INVENTION

1. Field of the Invention

The present invention relates generally to the field of semiconductor packaging, and more specifically to the interconnect between a C4 bump and a semiconductor die.

2. Discussion of Related Art

Presently, a semiconductor die is connected to a flip-chip package by a two dimensional array of C4 bumps. Power is routed through the package to the die via these C4 bumps. Power is further distributed from these C4 bumps to different parts of the die through metal interconnect lines in the top metal layers of the die.

FIG. 1 illustrates the connection between a C4 bump 102 and the top metal layer of the die 100. This connection is presently done through a single passivation opening, as illustrated in FIG. 1. C4 bump 102 is connected to a metal line 104 in the top metal layer through a single passivation opening 106. Typically, the C4 bump 102 has a diameter of 110 microns. The lines of the top metal layer are 20 microns wide, and the passivation opening 106 has an area of approximately 256 square microns (16 um×16 um).

Power is routed through the die by way of a number of metal layers. The top two metal layers are illustrated in FIG. 1. The metal lines 104 on the top metal layer distribute power to metal lines on lower metal layers, including metal lines 112 on the top-1 metal layer. Thus, power travels from a C4 bump 102, through a single passivation opening 106, to a top metal line 104 in the die, and is then routed to the top-1 metal layer lines 112 and other lower layer metal lines.

Current density and the ability for the power grid to reliably deliver current is a function of the metal stack and the EM (electromigration) capabilities of the metals and vias in the metal stack. Presently EM issues may be solved in several ways. For example, for a single passivation opening connection, when current crowding exceeds EM margins, an additional metal layer may be added to the metal stack to reduce current crowding, however this may increase the cost of manufacturing. Another alternative that may be used to reduce current crowding is to use a thicker metal layer or increase the pitch of the metal lines. This alternative may result in an undesirable reduction of signal routing capability. A further option is doping of the metal layers to allow for greater EM margins. Doping of the metal layers may increase the resistance of the metal lines, which is undesirable.

DETAILED DESCRIPTION OF THE PRESENT INVENTION

In the following description, numerous specific details are set forth, such as exact process steps, in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

A method of connecting a single C4 bump to multiple metal lines on the top metal layer of a die through multiple passivation openings is described, as well as methods of forming this connection. The use of multiple passivation openings to connect a single C4 bump may decrease electrical resistance between the die and the package. Current crowding and IR (voltage) drop on lower metal layers may also be reduced through the use of multiple passivation openings. An additional metal layer may not be required to reduce current crowding or IR drop.

Figure 1:
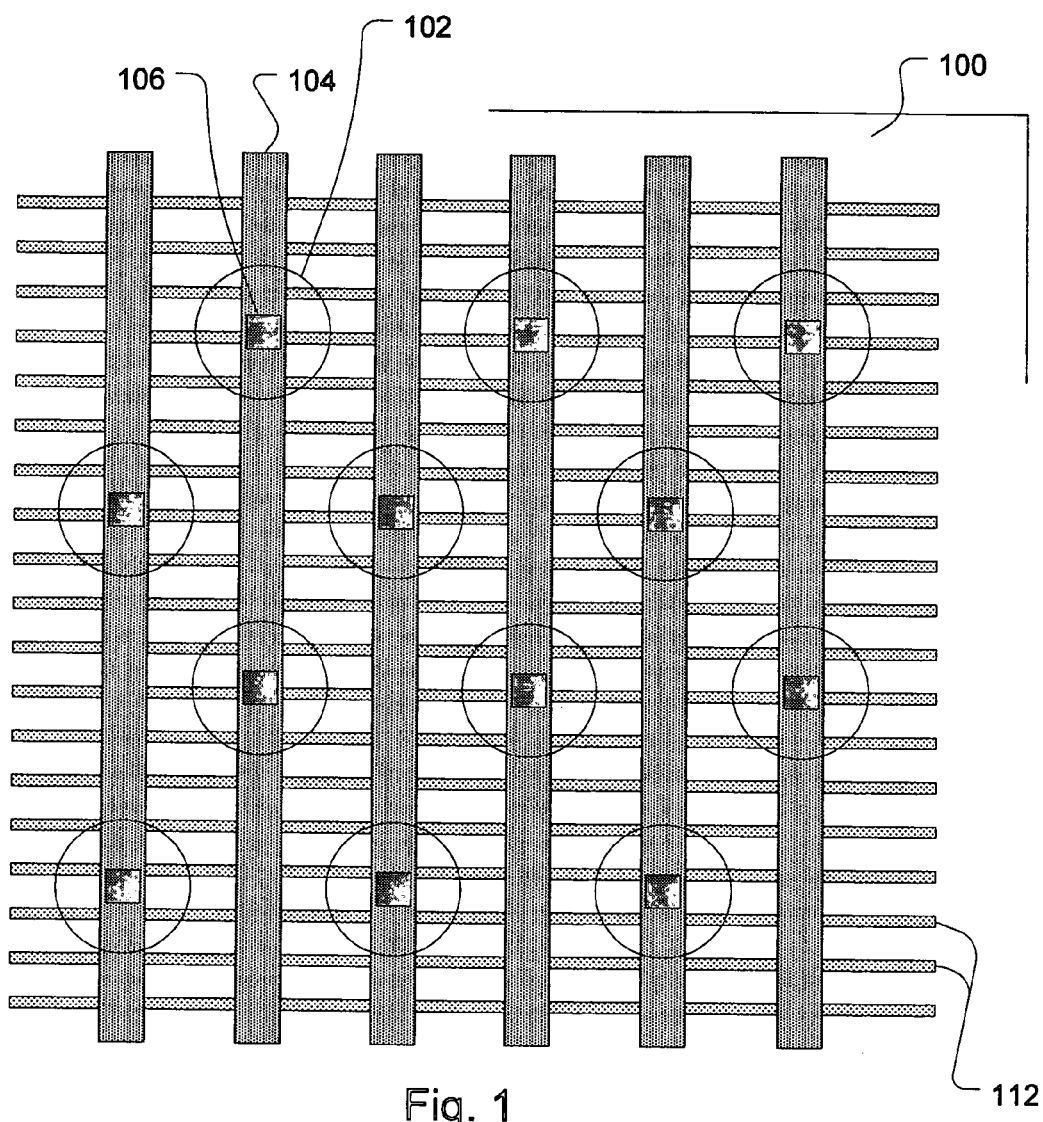
FIG. 1 is an illustration of an overhead view of an array of C4 bumps connected to the top metal layer of a die.
Figure 2:
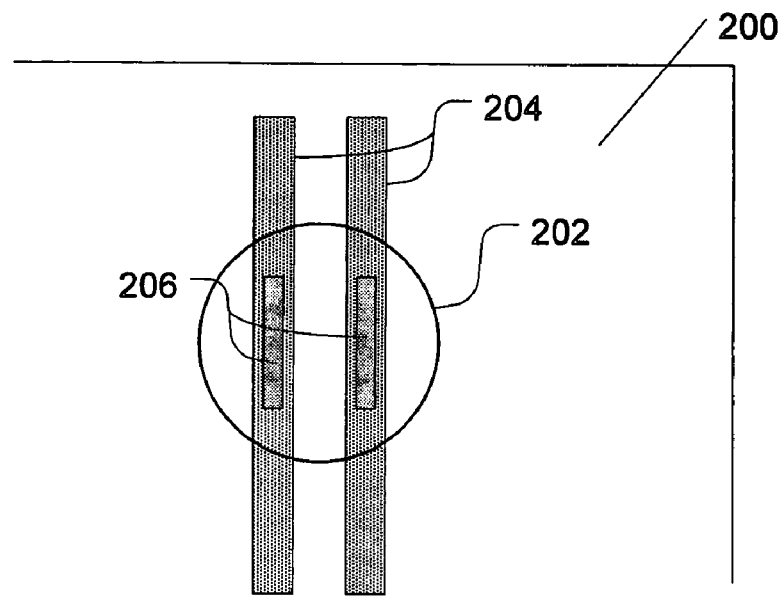
FIG. 2 is an illustration of an overhead view of a C4 bump connected to the top metal layer of the die in accordance with one embodiment of the present invention.

FIG. 2 illustrates a top view of a die 200 with a C4 bump 202 attached to the die according to one embodiment of the present invention. In one embodiment of the present invention, the C4 bump may be comprised of solder. In another embodiment of the present invention, the C4 bump may be comprised of another conductive material, such as copper. The C4 bump may have a diameter of approximately 110 um. C4 bump 202 may be connected to multiple top layer metal lines 204 through passivation openings 206 in the passivation layer. The dimensions of each of the two passivation openings under the C4 bump may be approximately equal to one another in size, however they may be of different sizes as well. In one embodiment, each of the two passivation openings under the C4 bump may be approximately 6 um wide by 30 um long. The passivation opening may be narrower than the width of the metal line 204. The total area of both passivation openings may be approximately 360 um$^2$. One passivation opening 206 may be provided for each metal line 204 to which the C4 bump connects. The metal lines 204 in the top metal layer may run substantially parallel to one another. In one embodiment of the present invention, the top layer metal lines are approximately 10 um wide, and are separated by approximately 50 um. Metal lines 204 may be comprised of copper or another conductive material.

The use of multiple passivation openings to connect the C4 bump to multiple metal lines may increase the total connection area between the C4 bump and the metal lines, as compared to the use of a single passivation opening and a single metal line. This increase in total connection area may effectively decrease the electrical resistance between the package and the die.

Figure 3:
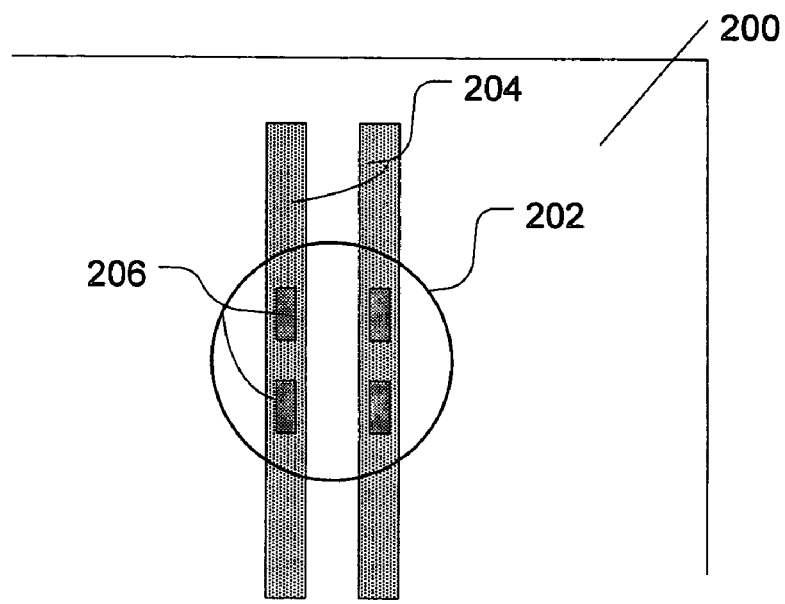
FIG. 3 is an illustration of an overhead view of a C4 bump connected to the top metal layer of the die in accordance with one embodiment of the present invention.

FIG. 3 illustrates another embodiment of the present invention. Two or more passivation openings 206 may be used to connect the C4 bump 202 to a single metal line 204. This may also effectively decrease the resistance between the package and the die by increasing the total connection area between the C4 bump and the metal line.

Each of the passivation openings 206 may be the same size, or they may be of different sizes. While the passivation openings 206 are shown vertically oriented with respect to each other in FIG. 3, the passivation openings 206 may also be horizontally oriented with respect to each another, such as in a side-by-side passivation opening configuration.

Figure 4:
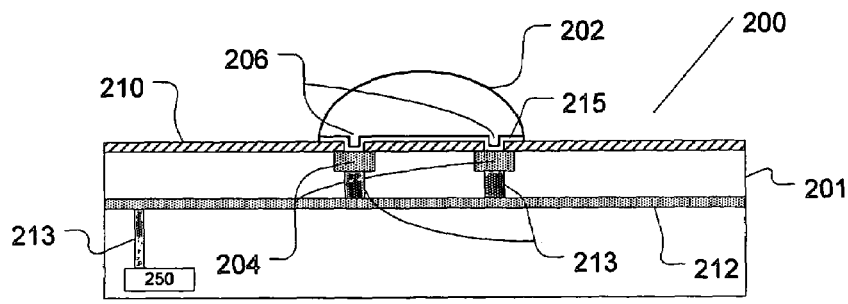
FIG. 4 is an illustration of a cross-sectional view of a C4 bump connected to the top metal layer of the die in accordance with one embodiment of the present invention.

FIG. 4 illustrates a cross-sectional view of the die of FIG. 2. Die 200 contains a substrate 201 and top metal layer metal lines 204. Die 200 may also contain multiple additional lower layer metal lines, such as top-1 metal line 212. Metal lines within the metal stack are connected to one another by vias, 213. Vias 213 connect top layer metal lines 204 to top-1 metal line 212. Integrated circuits 250, such as transistors or capacitors, may be formed within substrate 201. The integrated circuits may be connected to a metal layer in the metal stack by vias 213.

A passivation layer 210 formed on the top surface of the die 200 protects the surface of the die from external contamination and dust. Openings 206 are formed in the passivation layer such that the C4 bump 202 may be connected to multiple top layer metal lines 204. In one embodiment of the present invention, a C4 bump may be positioned over two passivation openings so that it may connect to two metal lines. In other embodiments, the C4 bump may be connected to more than two metal lines through more than two passivation openings. At least one passivation opening may be provided to connect the C4 bump to each metal line. In another embodiment, multiple passivation openings may be provided to connect the C4 bump to each metal line. In one embodiment, ball limiting metallurgy (BLM) 215 may be present beneath the C4 bump. The BLM layer(s) may be comprised of materials including, but not limited to, titanium, vanadium, aluminum, or nitride.

Figure 5:
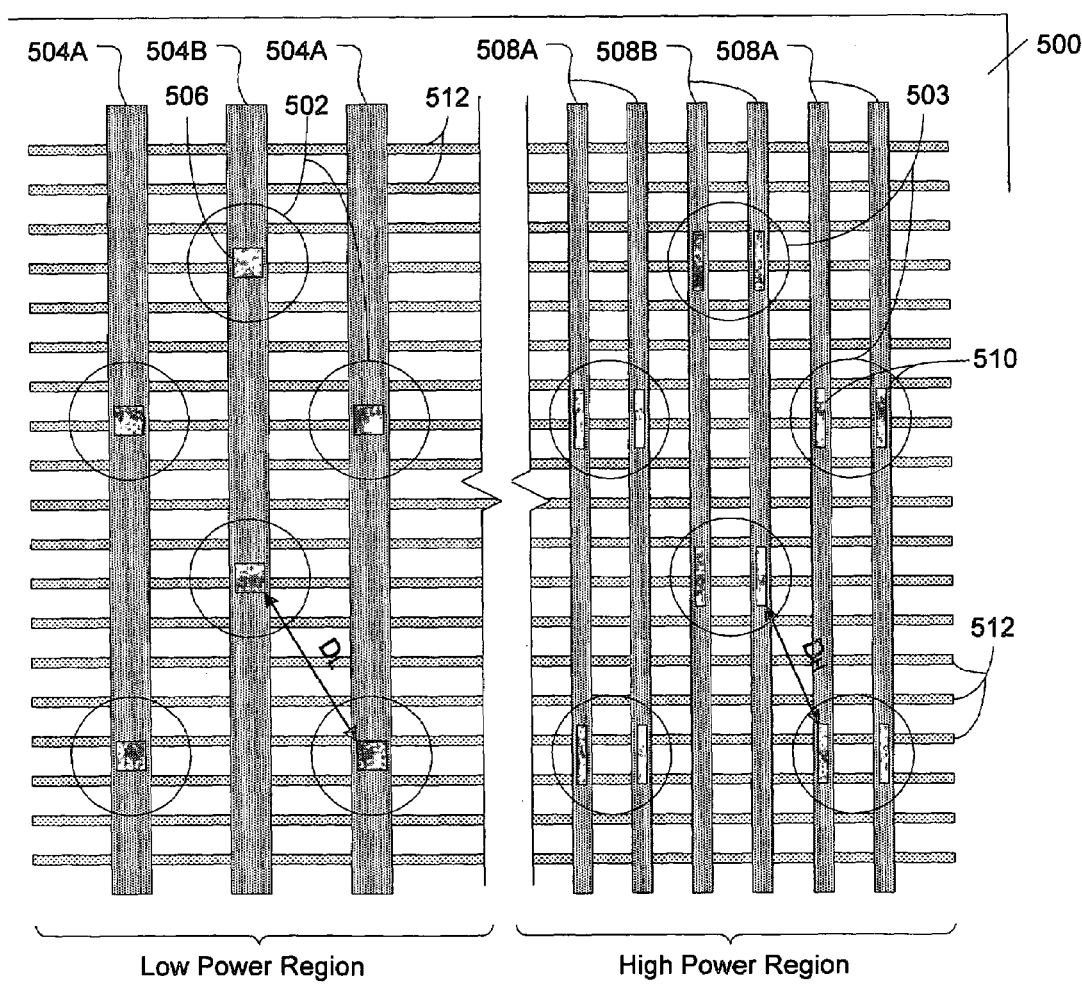
FIG. 5 is an illustration of an overhead view of an array of C4 bumps connected to the top metal layer of the die in accordance with one embodiment of the present invention.

FIG. 5 illustrates a top view of a die 500 having a high power region and a low power region according to one embodiment. In the high power region of the die, multiple passivation openings 510 are used to connect each C4 bump 503 to multiple metal lines, 508A or 508B, on the top metal layer of the die for power and ground connections. The high power regions of the die may be defined as those regions for which a lower current density is desirable in the local region around the C4 bumps and in the underlying metal layer. The high power regions of the die typically have a current density that is 3 to 4 times as great as the current density in the low power regions of the die.

Embodiments of the present invention decrease current density and current crowding on the top metal layer as well as on the metal layer immediately below the top metal layer of the die. For example, for a die having 8 metal layers, when current crowding exceeds EM (electromigration) margins on the 7th metal layer, it is desirable to use multiple passivation openings to connect the C4 bump to multiple metal lines on the top (8th) metal layer. Where multiple passivation openings are used to connect a single C4 bump to multiple metal lines on the top metal layer, current crowding may be decreased by up to 90%. The higher power regions of the die may also be defined as those regions for which a decreased IR drop is desirable. Embodiments of the present invention allow a decrease in IR drop for regions of the die where multiple passivation openings are used to connect the C4 bump to multiple metal lines on the top metal layer. Simulations show as much as a 60% improvement in IR drop. This improvement is cause by a reduction in resistance for the top two metal layers due to the enlarged passivation opening(s).

In one embodiment, C4 bumps 503 located in the high power region of the die are each connected to two narrow metal lines 508A or 508B on the top metal layer by two passivation openings 510. In one particular embodiment of the present invention, each passivation opening 510 which connects a single C4 bump to two narrow metal lines may be approximately 6 um×30 um in size, or a total area of approximately 360 um². Thus, in the high power region of the die, embodiments of the present invention may be used to increase the total area of the connection between the C4 bump and the die, as compared to the area of the connection in the low power region.

Power (Vcc) and ground (Vss) in the high power region 520 of the die are distributed to the die on alternate pairs of narrow top metal lines 508A and 508B. Narrow metal lines 508A are power rails (Vcc), and narrow metal lines 504B are ground rails (Vss). In the high power region, narrow metal lines 508A and 508B run substantially parallel to one another, and are approximately 10 um wide. The spacing between the narrow metal lines 508A and between narrow metal lines 508B may be between 20 and 70 um, and more particularly may be approximately equal to 50 um. Metal lines 508 distribute power to the lower metal layers, including metal lines 512. Metal lines 512 are on the top-1 metal layer lie directly beneath the top metal layer and run substantially perpendicular to top layer metal lines 508. In the high power regions of the die, power must travel a distance equal to $D_H$ on the top-1 metal lines 512 between the top layer Vcc and Vss C4 bumps to complete the current path. In one embodiment, this distance may be approximately 114 um. Thus, in the high power region, where multiple passivation openings are used under each C4 bump power travels a distance on the top-1 metal lines 30% shorter than that which may be achieved using a single passivation opening. Because the distance power must travel on the top-1 metal layer may be decreased significantly by the use of multiple passivation openings to connect a C4 bump to multiple metal lines, both the IR (voltage) drop and current crowding are reduced on the top-1 metal layer. Additionally, when using a multiple passivation opening topology, the width of the top-1 metal lines 512 may be decreased by approximately 30% to effectively route power to the die. This allows a greater number of signals to be routed on the top-1 metal layer.

In one embodiment, die 500 may also include a low power region. Low power regions are those regions where it has been determined that the EM margins and IR drop are adequate, and thus the EM margins and IR drop do not require reduction. In regions of low power, a single passivation opening 506 may be used to connect each C4 bump 502 to a single metal line, 504A or 504B, on the top metal layer of the die for power and ground connections. Single passivation openings may also be used for C4 bumps which are connected to I/O signals on the die. In one embodiment of the present invention, each passivation opening 506 which connects a single C4 bump to a single wide metal line may be approximately 16 um×16 um in size, or approximately 256 um². Power and ground in the low power region 510 of the die are distributed to the die on alternating wide top metal lines 504A and 504B. Wide metal lines 504A are power rails (Vcc), and wide metal line 504B is a ground rail (Vss). In the low power regions of the die, power must travel a distance equal to $D_L$ on the top-1 metal lines 512 between the top layer Vcc and Vss C4 bumps. In one embodiment, this distance may be approximately 160–170 um. In the low power region, metal lines 504A and 504B may run substantially parallel to one another, and may be approximately 20 um wide. The spacing of the wide metal lines 504 may be approximately 70–75 um. Metal lines 504 distribute power to the lower metal layers, including metal lines 512. Metal lines 512 on the top-1 metal layer lie directly beneath the top metal layer and run substantially perpendicular to top layer metal lines 504.

Figure 6:
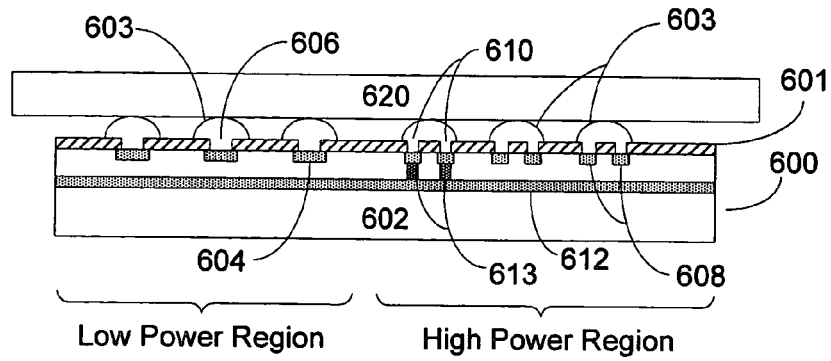
FIG. 6 is an illustration of a cross-sectional view of C4 bumps connecting a die to a package in accordance with one embodiment of the present invention.

FIG. 6 illustrates a cross-sectional view of a die and a package according to an embodiment of the present invention. C4 bumps 602 and 603 connect the flip-chip package 620 to the die 600. Power may be distributed from the flip chip package 620 through the C4 bump and through passivation opening(s) beneath the C4 bump, to multiple top layer metal lines. Power may then be further distributed throughout the die from the top metal layer metal line to additional metal layers located beneath the top metal layer, including top1 metal layer 612. Top-1 metal layer 612 is connected to top metal layer lines 608 by vias 613.

Multiple passivation openings 610 may be used to connect each C4 bump 603 to multiple metal lines 608 on the top metal layer of the die for power and ground connections in the high power regions of the die, as described above with respect to FIG. 5. Single passivation openings 606 may be used to connect the C4 bump 602 to a single metal line 604 on the top metal layer of the die 600 for power and ground connections in regions of lower power, as described above. Single passivation openings may also be used for C4 bumps which are connected to I/O signals on the die.

Figure 7:
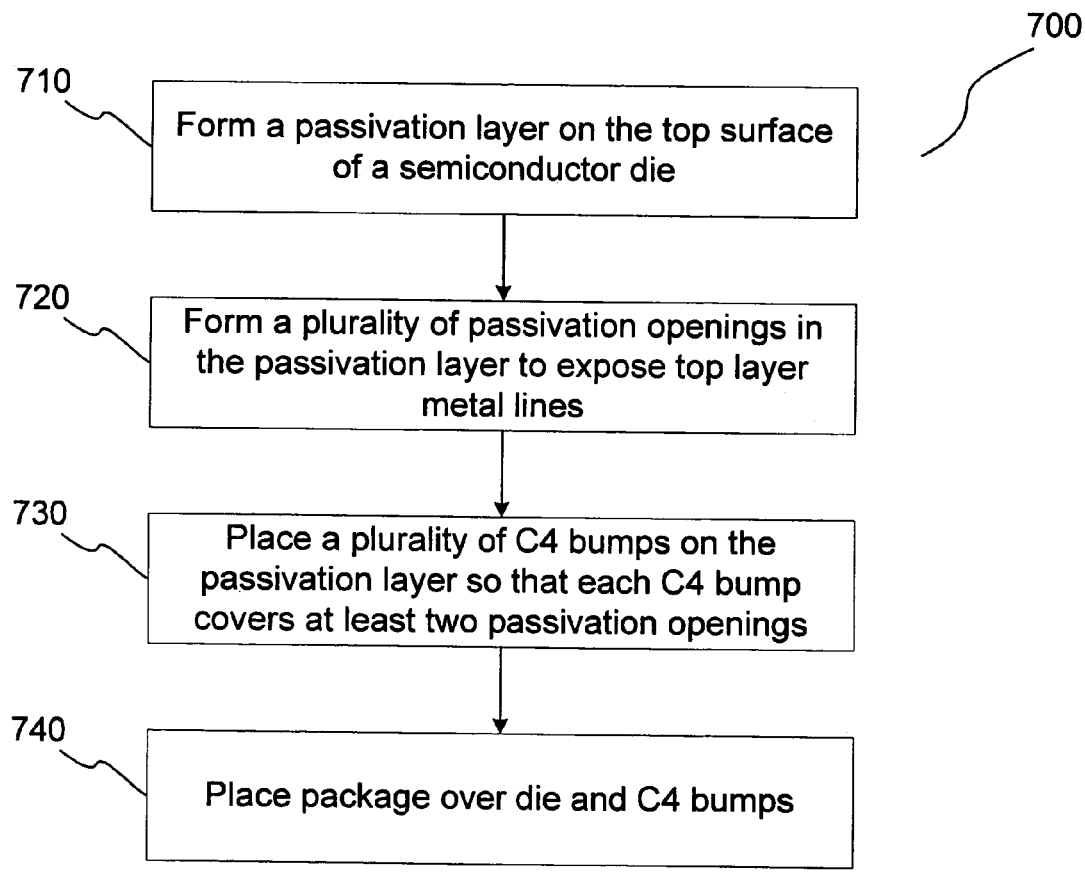
FIG. 7 is a flow diagram illustrating a method in accordance with one embodiment of the present invention.

FIG. 7 is a flow diagram, 700, showing a process in accordance with one embodiment of the present invention. First, as set forth in block 710, a passivation layer is formed on the top surface of a semiconductor die. The semiconductor die may contain metal lines, integrated circuits, or other circuit elements therein. The passivation layer may be grown or deposited on the top surface of the die.

Next, as set forth in block 720, passivation openings may be formed in the passivation layer. The passivation openings may be formed by patterning using a conventional lithography process. The passivation openings may be any shape or size, so long as they are no larger than the C4 bump that covers the passivation opening. In embodiments, the passivation openings may be square, rectangular, octagonal, or circular in shape. The passivation openings may range in size from approximately 50 um$^2$ to 500 um$^2$. When formed, the passivation openings may expose metal lines on the top metal layer of the die.

After the passivation openings are formed, a plurality of C4 bumps may be placed on the top surface of the die, over the passivation layer, as set forth in block 730. In the areas of high power, as described above, each C4 bump may cover at least two passivation openings, and may connect to at least two top layer metal lines. In areas of low power, or for I/O signals, each C4 bump may cover only one passivation opening, and may connect to only one top layer metal line.

Finally, as set forth in block 740, a package may be placed over the die and the C4 bumps, so that the C4 bumps electrically connect the die to the package.

The present invention may be implemented with various changes and substitutions to the illustrated embodiments. For example, as semiconductor technology scales to even smaller dimensions, the dimensions mentioned herein may be scaled down as well. Although specific embodiments, including specific parameters, methods, and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of this invention as expressed in the subjoined claims.

We claim:
1. An apparatus comprising:
    a die having a top metal layer, the top metal layer comprised of at least a first metal line and a second metal line, wherein the first metal line and the second metal line are one of a power rail and a ground rail and wherein said first and second metal lines are each connected to a lower metal layer beneath said first and second lines by a via;
    a passivation layer covering the top metal layer;
    an electrically conductive bump on the passivation layer; and
    a first passivation opening and a second passivation opening in the passivation layer, the first passivation opening electrically connecting the first metal line to the electrically conductive bump, and the second passivation opening electrically connecting the second metal line to the electrically conductive bump.
2. The apparatus of claim 1, wherein the first and second metal lines are comprised of copper.
3. The apparatus of claim 1, wherein the electrically conductive bump is comprised of solder.
4. The apparatus of claim 1, wherein the electrically conductive bump is a copper bump.
5. The apparatus of claim 1, wherein the electrically conductive bump is less than 120 um in diameter.
6. The apparatus of claim 1, wherein the first metal line and the second metal line are substantially parallel to each other.
7. The apparatus of claim 6, wherein the first metal line and the second metal line are separated by less than 50 um.
8. The apparatus of claim 1, wherein the first metal line and the second metal line are less than 10 um wide.
9. The apparatus of claim 1, wherein the electrically conductive bump is a D4 bump.
10. An apparatus comprising:
    a die having a top metal layer, the top metal layer comprised of at least a first metal line and a second metal line, wherein the first metal line and the second metal line are one of a power rail and a ground rail and wherein said first and second metal lines are each connected to a lower metal layer beneath said first and second lines by a via;
    a passivation layer covering the top metal layer, the passivation layer containing a plurality of passivation openings; and
    a plurality of electrically conductive bumps placed on the passivation layer, each of the plurality of electrically conductive bumps covering at least two passivation openings and electrically connecting to at least the first metal line and the second metal line.
11. The apparatus of claim 10, further comprising a second metal layer directly beneath the top metal layer.
12. The apparatus of claim 11, wherein the second metal layer is comprised of a plurality of metal lines which run substantially perpendicular to the first metal line and the second metal line.
13. The apparatus of claim 12, wherein the first metal line, the second metal line, and the plurality of metal lines are comprised of copper.
14. The apparatus of claim 10, wherein each of the plurality of electrically conductive bumps comprises copper.
15. The apparatus of claim 14, wherein each of the plurality of electrically conductive bumps is less than 120 urn in diameter and is located less than 75 urn from another electrically conductive bump.

16. The apparatus of claim 10, wherein each of the plurality of electrically conductive bumps comprises solder.

17. The apparatus of claim 10, wherein the first metal line and the second metal line are substantially parallel to each other.

18. The apparatus of claim 10, wherein the first metal line and the second metal line are less than 10 um wide.

19. The apparatus of claim 10, wherein the first metal line and the second metal line are separated by less than 50 um.

20. The apparatus of claim 10, wherein the electrically conductive bump is a C4 bump.

* * * * *

UNITED STATES PATENT AND TRADEMARK OFFICE
CERTIFICATE OF CORRECTION

| | | |
|---|---|---|
| PATENT NO. | : 7,180,195 B2 | Page 1 of 1 |
| APPLICATION NO. | : 10/739726 | |
| DATED | : February 20, 2006 | |
| INVENTOR(S) | : Bohr et al. | |

It is certified that error appears in the above-identified patent and that said Letters Patent is hereby corrected as shown below:

In column 6, at line 36, delete "D4" and insert --C4--.
In column 6, at line 66, delete both occurrences of "urn" and insert --um--.

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,180,195 B2 |
| APPLICATION NO. | : 10/739726 |
| DATED | : February 20, 2007 |
| INVENTOR(S) | : Bohr et al. |

It is certified that error appears in the above-identified patent and that said Letters Patent is hereby corrected as shown below:

In column 6, at line 36, delete "D4" and insert --C4--.
In column 6, at line 66, delete both occurrences of "urn" and insert --um--.

This certificate supersedes Certificate of Correction issued September 4, 2007.

Signed and Sealed this

Ninth Day of October, 2007

JON W. DUDAS
*Director of the United States Patent and Trademark Office*